United States Patent
Hirosawa (10) Patent No.: US 8,486,806 B2
(45) Date of Patent: Jul. 16, 2013

(54) METHOD FOR MACHINING WAFERS BY CUTTING PARTWAY THROUGH A PERIPHERAL SURPLUS REGION TO FORM BREAK STARTING POINTS

(75) Inventor: Shunichiro Hirosawa, Ota-Ku (JP)

(73) Assignee: Disco Corporation, Tokyo (JP)

( * ) Notice: Subject to any disclaimer, the term of this patent is extended or adjusted under 35 U.S.C. 154(b) by 73 days.

(21) Appl. No.: 13/217,468

(22) Filed: Aug. 25, 2011

(65) Prior Publication Data

US 2012/0064696 A1  Mar. 15, 2012

(30) Foreign Application Priority Data

Sep. 10, 2010 (JP) .................................. 2010-202845

(51) Int. Cl.
*H01L 21/00* (2006.01)
(52) U.S. Cl.
USPC ......................................... 438/463; 438/464
(58) Field of Classification Search
USPC ........... 438/113, 114, 463, 464; 257/E21.599
See application file for complete search history.

(56) References Cited

U.S. PATENT DOCUMENTS

| 2007/0275543 | A1* | 11/2007 | Abe et al. ...................... 438/464 |
| 2009/0011572 | A1* | 1/2009 | Kaneko .......................... 438/463 |
| 2009/0197395 | A1* | 8/2009 | Nakamura et al. ............ 438/463 |
| 2010/0048000 | A1* | 2/2010 | Kobayashi et al. ........... 438/463 |

FOREIGN PATENT DOCUMENTS

| JP | 2007-019379 | 1/2007 |
| JP | 2007-173487 | 7/2007 |

* cited by examiner

*Primary Examiner* — Kevin Parendo
(74) *Attorney, Agent, or Firm* — Greer, Burns & Crain, Ltd.

(57) ABSTRACT

A wafer having a device region and a peripheral surplus region surrounding the device region is divided into individual devices. The back side of the device region is ground to form an annular reinforcement part on the outer peripheral side thereof. A dicing tape is adhered to the back side of the wafer, and the wafer is irradiated with a laser beam from the face side so as to divide the wafer into the devices and to form break starting points in the annular reinforcement part. The dicing tape is expanded so as to disassemble the annular reinforcement part, with the break starting points as starting points, thereby separating the annular reinforcement part from the device region, and widening the interval between the adjacent devices. Since the annular reinforcement part is intact when the wafer is divided, handleability during the divided process is not spoiled.

2 Claims, 7 Drawing Sheets

METHOD FOR MACHINING WAFERS BY CUTTING PARTWAY THROUGH A PERIPHERAL SURPLUS REGION TO FORM BREAK STARTING POINTS

BACKGROUND OF THE INVENTION

1. Field of the Invention

The present invention relates to a machining method by which a wafer is divided into individual devices through irradiation with a laser beam.

2. Description of the Related Art

In the semiconductor device manufacturing process, a plurality of regions are demarcated by planned dividing lines, called streets, arranged in a grid pattern on the face side of a substantially circular disc-shaped semiconductor wafer, and devices such as ICs, LSIs, etc. are formed in the thus demarcated regions. Thereafter, the semiconductor wafer is cut along the streets by a cutting apparatus, and the semiconductor wafer is divided into individual semiconductor chips (devices). The wafer to be divided is ground on the back side thereof so as to have a predetermined thickness before being cut along the streets. In recent years, the thickness of the wafer is demanded to be reduced to a smaller value, for example, about 50 µm, in order to achieve reductions in the weight and size of electric apparatuses in which the individual semiconductor chips are used.

The wafer thus made thinner becomes nerveless like paper and difficult to handle, so that the wafer may be broken during its conveyance or the like. To cope with this problem, therefore, a grinding method has been proposed in which the back side of the wafer is ground only in an area corresponding to the device region so as to form an annular reinforcement part on the back side of the wafer in an area corresponding to a peripheral surplus region surrounding the device region (see, for example, Japanese Patent Laid-open No. 2007-173487). In addition, as a method by which the wafer thus formed with the annular reinforcement part at the outer periphery on the back side thereof is divided along the streets (planned dividing lines), a method has been proposed in which the wafer is cut by a cutting blade from the face side after the annular reinforcement part is removed (see, for example, Japanese Patent Laid-open No. 2007-19379).

SUMMARY OF THE INVENTION

However, the wafer from which the annular reinforcement part has been removed is susceptible to breakage while handled at the time of dicing. In dividing into the individual devices the wafer formed with the annular reinforcement part at the outer periphery on the back side thereof, therefore, the timing for removing the annular reinforcement part matters.

Accordingly, it is an object of the present invention to provide a wafer machining method by which a wafer ground to be thin in a central area, leaving an annular reinforcement part at the outer periphery thereof, can be divided into individual devices without spoiling handleability during a dicing process.

In accordance with an aspect of the present invention, there is provided a method of machining a wafer provided on a face side thereof with a device region where a plurality of devices are demarcated by planned dividing lines, and with a peripheral surplus region surrounding the device regions, so as to divide the wafer into the individual devices, the method including: a wafer grinding step of grinding a back side corresponding to the device region of the wafer to a predetermined thickness and forming an annular reinforcement part at the back side corresponding to the peripheral surplus region; a wafer supporting step of adhering a dicing tape to the back side of the wafer and adhering an outer peripheral part of the dicing tape to a dicing frame having an opening for containing the wafer, so as to support the wafer by the dicing frame through the dicing tape; a wafer holding step of holding the wafer, supported by the dicing frame, on a chuck table which has a device region holding section for holding by suction the back side corresponding to the device region of the wafer and an annular reinforcement part supporting section for supporting the annular reinforcement part; an ablation machining step of performing ablation machining by irradiating the wafer with a laser beam along the planned dividing lines from the face side so as to divide the wafer into the individual devices and to form break starting points in the annular reinforcement part; an expanding step of expanding the dicing tape so as to disassemble the annular reinforcement part, with the break starting points as starting points, thereby separating the annular reinforcement part from the device region, and to widen the gap between the adjacent devices; and a pick-up step of picking up the individual devices from the dicing tape.

According to the present invention, the break starting points are formed in the annular reinforcement part in the ablation step of dividing the wafer into the individual devices, and the annular reinforcement part is separated from the device region in the expanding step of widening the gap between the adjacent devices. This ensures that the annular reinforcement part is remaining at the time of dividing the wafer into the individual devices. Therefore, the wafer can be divided into the individual devices, without spoiling the handleability during the dividing of the wafer. In addition, the step of separating the annular reinforcement part from the device region is carried out in the expanding step, and there is no need for an independent step for separation of the annular reinforcement part. This promises a high productivity.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
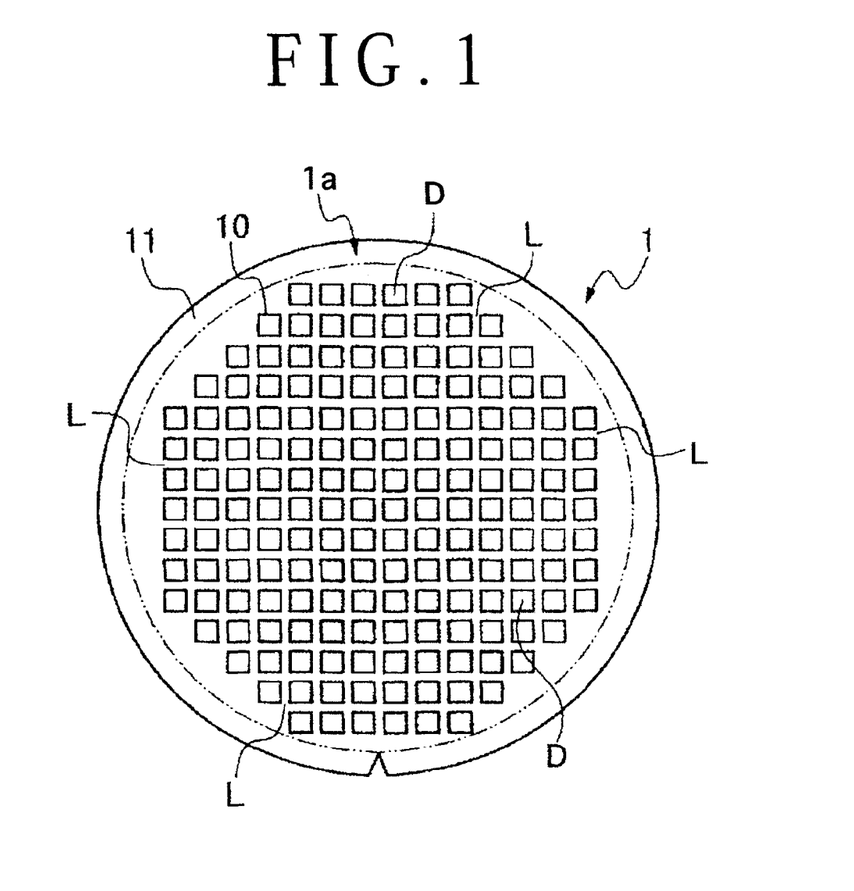
FIG. 1 is a plan view showing an example of a wafer.

A wafer 1 shown in FIG. 1 is a silicon wafer, a semiconductor wafer of gallium-arsenic, silicon carbide, or the like, or a wafer of a sapphire inorganic material substrate. Its face side 1a is provided with a device region 10 where a plurality of devices D are demarcated by planned dividing lines L, and with a peripheral surplus region 11 which surrounds the device region 10 and in which no device is formed. In other words, the device region 10 is a region in which chips to be products are present, and the peripheral surplus region 11 is a region in which chips to be products are absent.

Hereafter, description will be made of the machining method according to the present invention wherein a part on the back side of the device region 10 of the wafer 1 is ground so that an annular reinforcement part thicker than the ground part is formed in the periphery of the ground part, thereafter the device region 10 is cut and divided by laser beam machining along the planned dividing lines L, further the annular reinforcement part is separated from the device region, and the individual devices are picked up.

(1) Wafer Grinding Step

Figure 2:
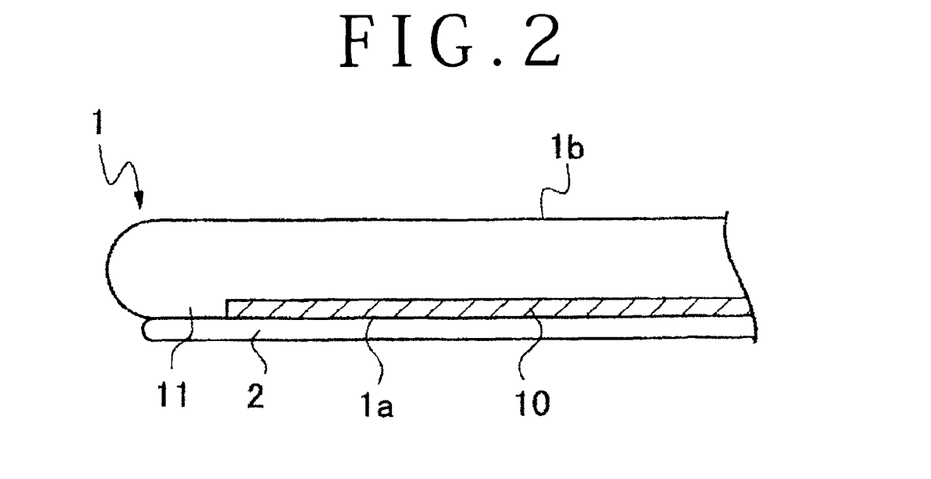
FIG. 2 is a sectional view showing schematically a state in which a protective tape is adhered to the face side of the wafer.

First, as shown in FIG. 2, a protective tape 2 for protecting the devices is adhered to the face side 1a of the wafer 1. Then, a back side 1b of the wafer 1 with the protective tape 2 adhered to the face side 1a thereof is ground, by use of a grinding apparatus 3 shown in FIG. 3, for example. The grinding apparatus 3 includes a chuck table 30 capable of being rotated while holding the wafer thereon, and grinding means 31 for grinding the wafer held on the chuck table 30. The grinding means 31 includes a rotating shaft 310 having an axis set vertical, and a grinding wheel 311 provided at the lower end of the rotating shaft 310. A plurality of grindstones 312 are firmly attached, in an annular pattern, to the lower surface of the grinding wheel 311.

Figure 3:
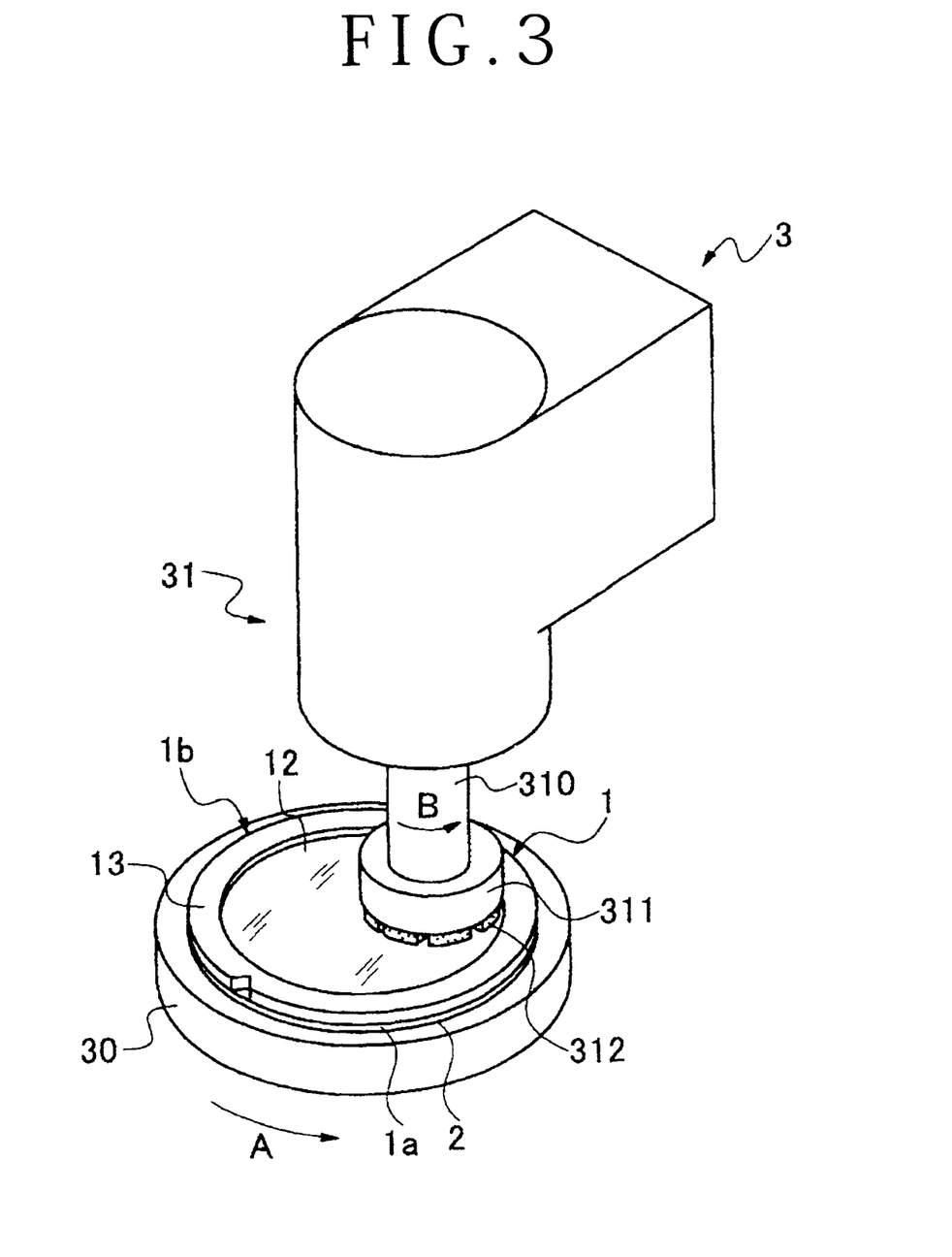
FIG. 3 is a perspective view showing a state in which the back side corresponding to a device region of the wafer is ground.
Figure 4:
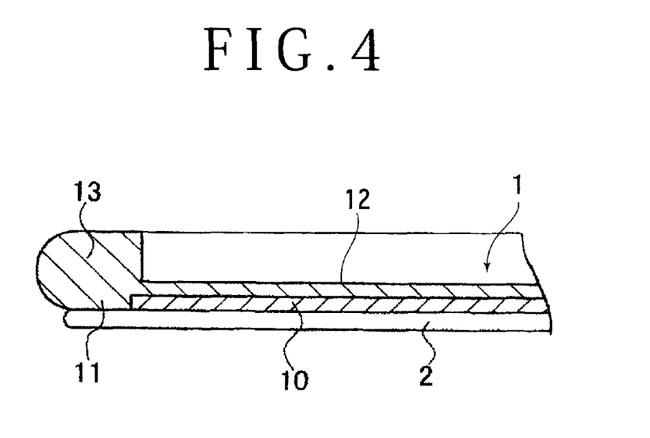
FIG. 4 is a sectional view showing schematically a state in which a recess is formed at the back side of the device region of the wafer and an annular reinforcement part is formed on the outer peripheral side of the recess.

Of the wafer 1, the protective tape 2 side is held by the chuck table 30, and the back side 1b is left exposed. Then, the chuck table 30 is rotated in the direction of arrow A at a rotating speed of, for example, 300 rpm, and, while rotating the rotating shaft 310 at a rotating speed of, for example, 6000 rpm, the grinding means 31 is lowered so that the grindstones 312 being rotated are brought into contact with the back side 1b of the wafer 1. In this case, the grindstones 312 are put into contact with only that part of the back side 1b of the wafer 1 which is on the back side of the device region 10 of the face side 1a, and are not put into contact with the outer peripheral side of that part. In addition, the center of rotation of the chuck table 30 and the center of rotation of the grindstones 311 are eccentric to each other, and the grindstones 311 are always kept in contact with the center of rotation of the wafer 1. As a result, as shown in FIGS. 3 and 4, the part thus ground is formed to have a predetermined thickness, resulting in formation of a recess 12; on the other hand, an annular reinforcement part 13 larger in thickness than the ground part is formed on the outer peripheral side of the recess 12, namely, at the back side corresponding to the peripheral surplus region 11. For example, in the case of a wafer having a diameter of 8 inches, the thickness of the device region 10 is about 50 μm, and the thickness of the annular reinforcement part 13 is about 600 μm.

(2) Wafer Supporting Step

Figure 5:
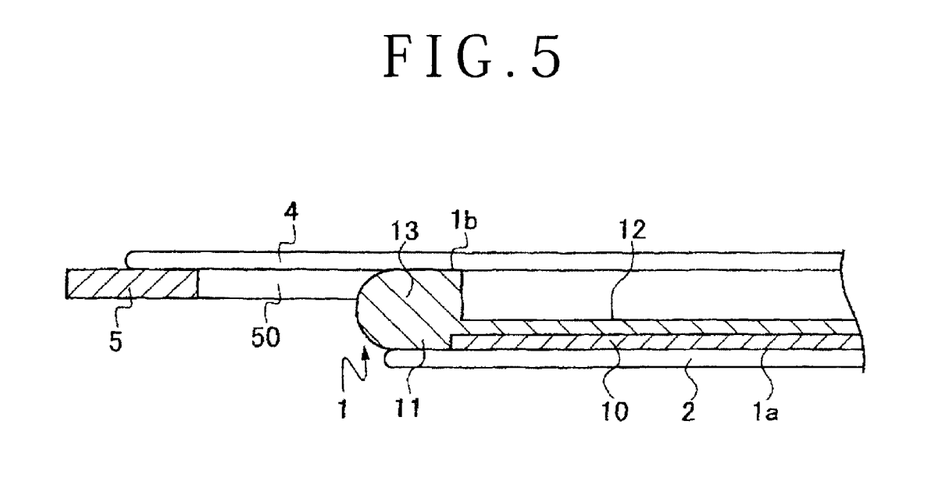
FIG. 5 is a sectional view showing schematically a state in which a dicing tape is adhered to the back side of the wafer.

Next, as shown in FIG. 5, a dicing tape 4 is adhered to the back side 1b of the wafer 1. To an outer peripheral portion of the dicing tape 4 is adhered to a dicing frame 5 formed in an annular shape. The dicing frame 5 is formed therein with an opening 50, which is closed with the dicing tape 4, and the wafer 1 is adhered to the thus closed part, whereby the wafer 1 is supported by the dicing tape 5.

(3) Wafer Holding Step

Figure 6:
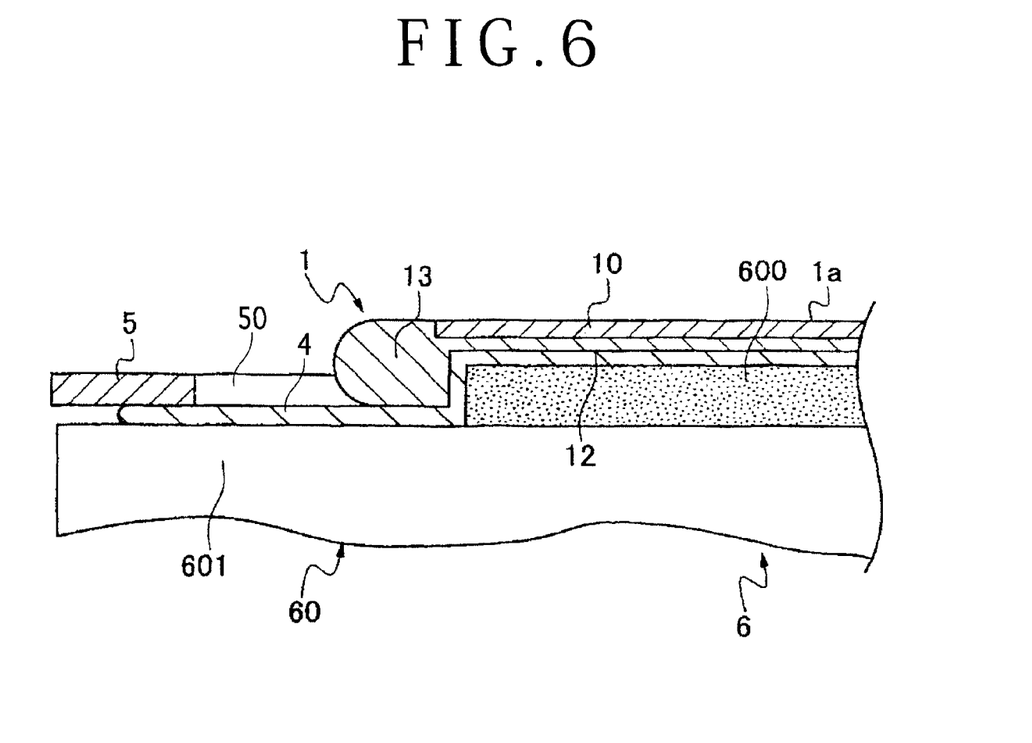
FIG. 6 is a sectional view showing schematically a state in which the wafer is held on a chuck table of a laser beam machining apparatus.

As shown in FIG. 6, the wafer 1 supported on the dicing frame 5 together with the dicing tape 4 adhered to the back side 1b thereof is held on a chuck table 60 of a laser beam machining apparatus 6, after the protective tape 2 is peeled off from the face side 1a thereof. The chuck table 60 includes a device region holding section 600 for holding by suction the back side corresponding to the device region 10 of the wafer 1, and an annular reinforcement part supporting section 601 for supporting the annular reinforcement part 13. The device region holding section 600 communicates with a suction source (not shown), and projects to the upper side relative to the annular reinforcement part supporting section 601. Application of suction to the back side of the wafer 1 results in a state in which the device region holding section 600 is contained in the recess 12, whereby the wafer 1 is held. In this instance, the dicing tape 4 is held in the state of being sandwiched between the device region supporting section 600 and the recess 12.

(4) Ablation Step

Figure 7:
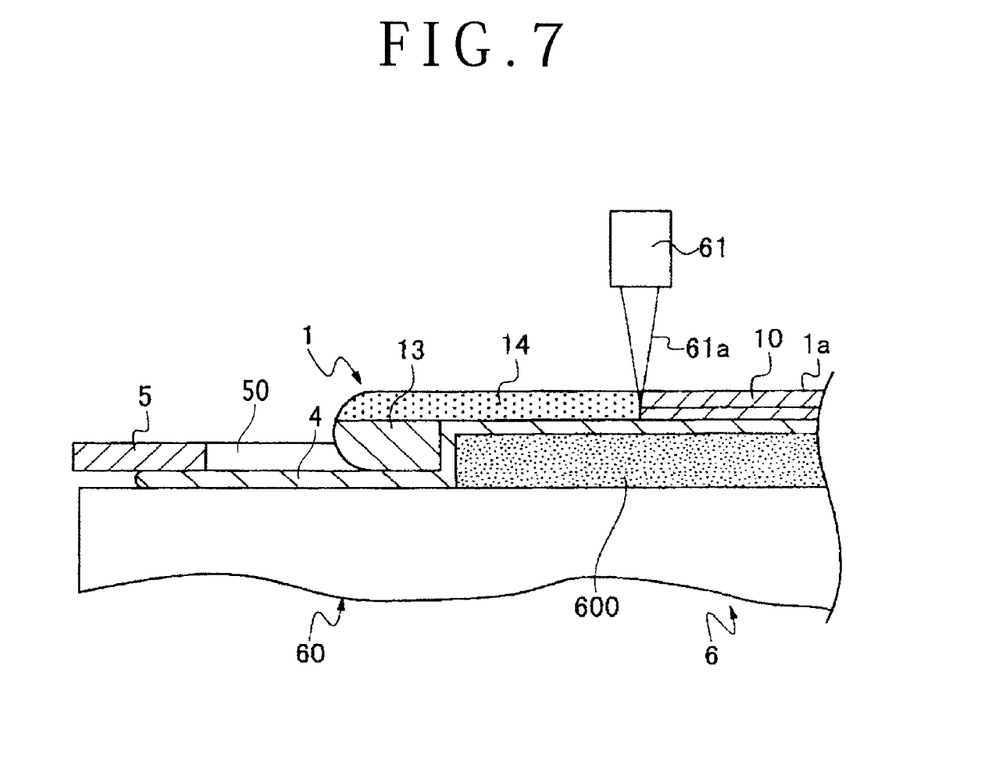
FIG. 7 is a sectional view showing schematically a state in which the wafer is subjected to ablation machining.

As shown in FIG. 7, the laser beam machining apparatus 6 has an irradiation head 61 for radiating a laser beam downward. When the wafer 1 is held on the chuck table 60 with its face side 1a exposed, the chuck table 6 and the irradiation head 61 are relatively moved horizontally, and, concurrently with the relative movement, irradiation with the laser beam 61a from the side of the face side 1a is conducted along the planned dividing lines L shown in FIG. 1.

In the ablation step, irradiation with the laser beam 61 a is started in a state in which the irradiation head 61 is first located on the upper side of the planned dividing line L in the annular reinforcement part 13. Then, while moving the chuck table 60 in an X-direction, irradiation with the laser beam 61a is applied also to the device region 10. Further, the laser beam 61a having passed through the device region 10 is made to irradiate the annular reinforcement part 13 therewith. The condensing position in the thickness direction of the laser beam 61a in the annular reinforcement part 13 and the device region 10 is set in the vicinity of the face side 1a. Thus, the laser beam 61a is condensed into the vicinity of the face side 1a, and a series of ablation regions 14 is formed on side of the face side 1a over the range from one end to the other end of the planned dividing line L. Such a machining is applied to all the planned dividing lines L.

Figure 8:
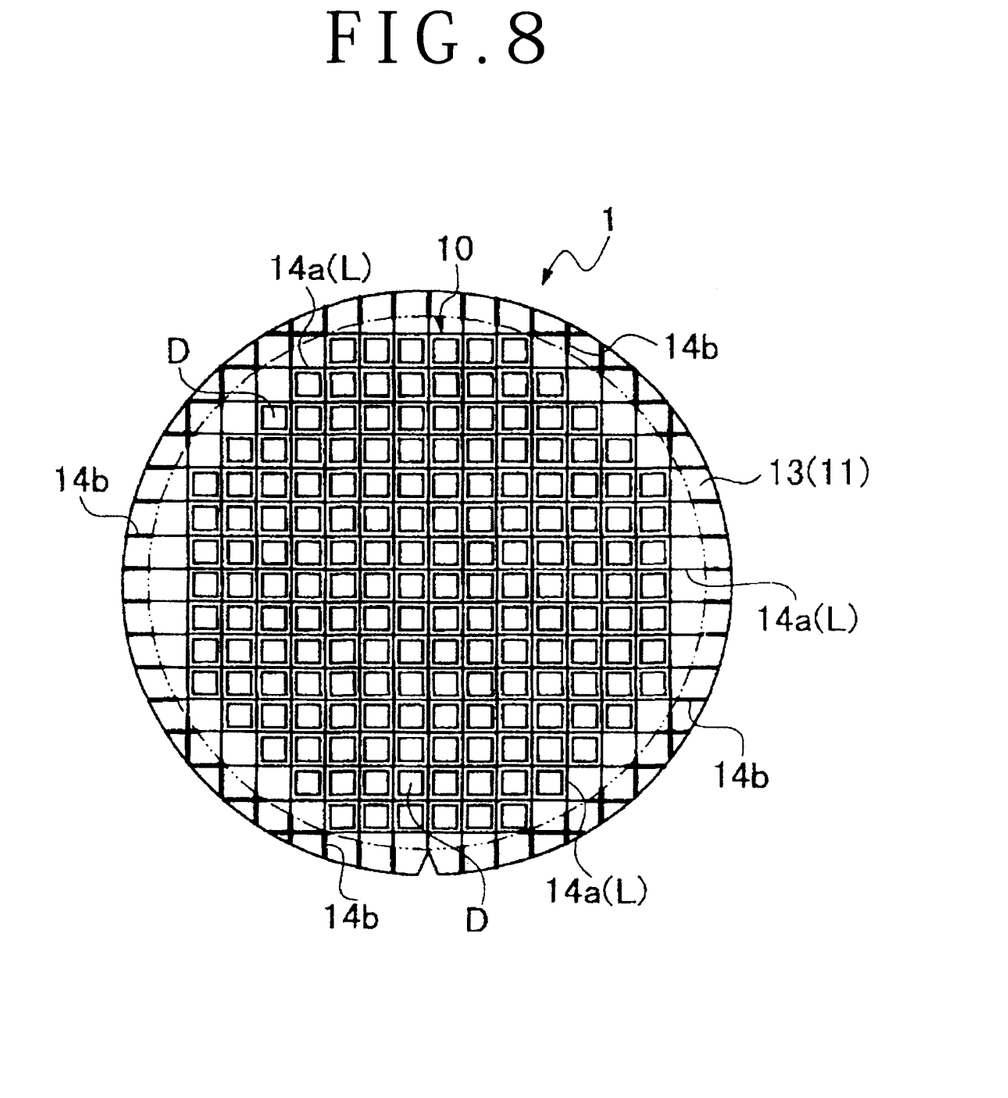
FIG. 8 is a plan view showing the wafer having undergone the ablation machining.

When the laser beam is thus condensed into the vicinity of the face side in the device region 10 and the annular reinforcement part 13 along the planned dividing lines L, the following takes place. In the device region 10, the ablation regions 14 are formed along all the planned dividing lines L to penetrate the wafer from the face side to the back side. Thus, as shown in FIG. 8, ablation grooves 14a are formed in a grid-like overall pattern along the planned dividing lines L. The formation of the ablation grooves 14a causes the wafer 1 to be divided into chips on the basis of each individual device D.

On the other hand, since the annular reinforcement part 13 is formed to be thicker than the device region 10, as shown in FIG. 7, the ablation regions 14 here do not penetrate the annular reinforcement part 13, resulting in that cutting-through does not occur but half-cut grooves are formed. The half-cut grooves are break starting points 14b indicated in bold line in FIG. 8. The break starting points 14b are formed on extension lines of the ablation grooves 14a formed in the device region 10. The break starting points 14b are grooves which are formed on the face side and do not penetrate to reach the back side, and they function as starting points for disassembly of the annular reinforcement part 13 in a later expanding step. Since the ablation grooves 14a and the break starting points 14b are equal in condensation depth, they can be formed by a series of ablation machining without lowering productivity.

(5) Expanding Step

Figure 9:
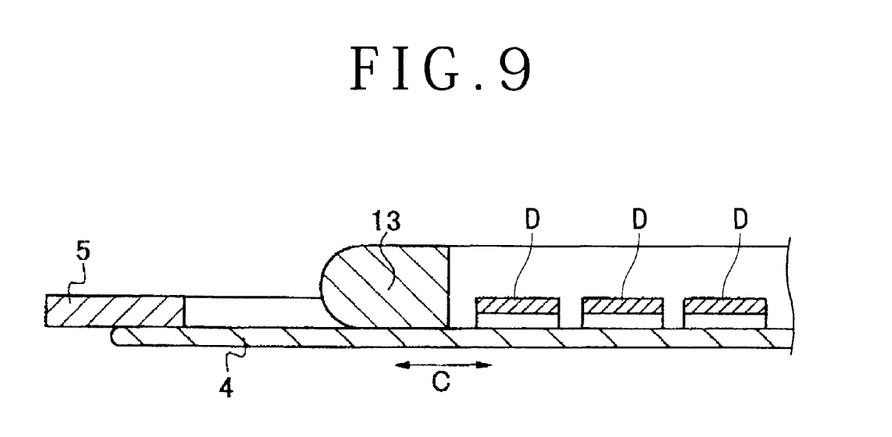
FIG. 9 is a sectional view showing a state in which the interval between the adjacent devices has been widened.

After the device region 10 is divided into the individual chips and the break starting points 14b are formed in the annular reinforcement part 13 as shown in FIG. 8, the plurality of devices D retaining the shape of the wafer 1 as a whole by being supported by the dicing frame 5 are dismounted from the chuck table 60 shown in FIG. 7. Then, as shown in FIG. 9, the dicing tape 4 is expanded in plane directions (C-directions in FIG. 9), whereby the gap between the adjacent devices is widened. Besides, in this instance, the annular reinforcement part 13 is disassembled, with the break starting points 14b as starting points, to be separated from the device region 10. Thus, the widening of the gap between the devices and the separation of the annular reinforcement part 13 can be carried out simultaneously. This promises a high productivity.

(6) Pick-up Step

Figure 10:
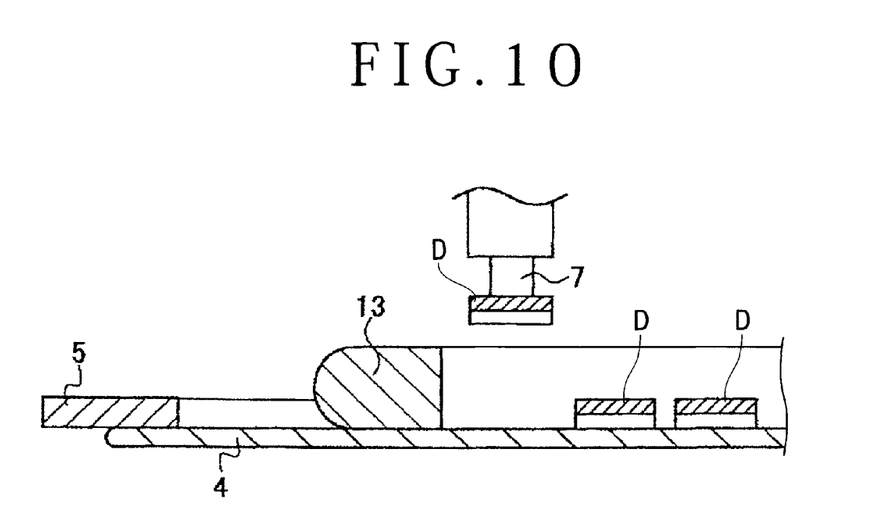
FIG. 10 is a sectional view showing schematically a state in which the device is picked up.

Subsequently, in the state in which the gap between the devices has been widened, pick-up of each of the individual devices D is carried out. For example, as shown in FIG. 10, a collet 7 is lowered, the device D is attracted onto the collet 7 by suction, the collet 4 is raised to thereby peel the device D from the dicing tape 4 and to pick up the device D, and the device D is conveyed to a predetermined position. Incidentally, where a UV-curing tape is used as the dicing tape 4, the dicing tape 4 may be irradiated with UV rays to lower its tackiness before the pick-up, whereby the pick-up can be performed more smoothly.

As above-mentioned, the break starting points are formed in the annular reinforcement part in the ablation step for dividing the wafer into the individual devices, and the annular reinforcement part is separated from the device region in the expanding step for widening the gap between the adjacent devices. This ensures that the annular reinforcement part is remaining at the time of dividing the wafer into the individual devices. Therefore, the wafer can be divided into the individual devices without spoiling the handleability during the dividing process. In addition, the separation of the annular reinforcement part can be carried out in the expanding step for widening the gap between the devices. This eliminates the need for an independent step of separating the annular reinforcement part, and, hence, promises a high productivity.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of machining a wafer provided on a face side thereof with a device region where a plurality of devices are demarcated by planned dividing lines, and with a peripheral surplus region surrounding the device region, so as to divide the wafer into the individual devices, the method comprising:
   a wafer grinding step of grinding a back side corresponding to the device region of the wafer to a predetermined thickness and forming an annular reinforcement part at the back side corresponding to the peripheral surplus region;
   a wafer supporting step of adhering a dicing tape to the back side of the wafer and adhering an outer peripheral part of the dicing tape to a dicing frame having an opening for containing the wafer, so as to support the wafer by the dicing frame through the dicing tape;
   a wafer holding step of holding the wafer, supported by the dicing frame, on a chuck table which has a device region holding section for holding by suction the back side corresponding to the device region of the wafer and an annular reinforcement part supporting section for supporting the annular reinforcement part;
   an ablation machining step of performing ablation machining by irradiating the wafer from the face side with a laser beam from one outside edge of the annular reinforcing part along the planned dividing lines to the other outside edge of the annular reinforcing part through the device region, so that the laser beam penetrates the wafer from the face side to the back side in the device region to divide the wafer into the individual devices and from the face side to a groove having a depth not reaching the back side in the annular reinforcement part to form break starting points in the annular reinforcement part;
   an expanding step of expanding the dicing tape so as to disassemble the annular reinforcement part, with the break starting points as starting points, thereby separating the annular reinforcement part from the device region, and to widen the gap between the adjacent devices; and
   a pick-up step of picking up the individual devices from the dicing tape.

2. A method of machining a wafer as in claim 1, wherein a condensing position of the laser beam in the thickness direction remains constant in the annular reinforcing part and the device region of the wafer while performing the ablation machining step.

* * * * *